US007005642B2

(12) United States Patent
Nozu

(10) Patent No.: US 7,005,642 B2
(45) Date of Patent: Feb. 28, 2006

(54) INFRARED SENSOR AND ELECTRONIC DEVICE USING THE SAME

(75) Inventor: Shinya Nozu, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 181 days.

(21) Appl. No.: 10/448,047

(22) Filed: May 30, 2003

(65) Prior Publication Data

US 2003/0222218 A1  Dec. 4, 2003

(30) Foreign Application Priority Data

May 31, 2002 (JP) .............................. 2002-159780

(51) Int. Cl.
*G01J 5/00* (2006.01)
(52) U.S. Cl. ................................. 250/338.1
(58) Field of Classification Search ............. 250/338.1, 250/352, 353
See application file for complete search history.

(56) References Cited

U.S. PATENT DOCUMENTS 5,655,839 A * 8/1997 Schmidt et al. ............. 374/132
6,348,650 B1 * 2/2002 Endo et al. .................. 136/201
6,565,254 B1 * 5/2003 Sato et al. ................... 374/132
2003/0141455 A1 * 7/2003 Lambert et al. ............. 250/353

FOREIGN PATENT DOCUMENTS

| JP | 63-169768 | 7/1988 |
| JP | AA 8-101062 | 4/1996 |
| JP | 2000-340848 | 12/2000 |
| JP | 2001-349787 | 12/2001 |

* cited by examiner

*Primary Examiner*—Constantine Hannaher
(74) *Attorney, Agent, or Firm*—Keating & Bennett, LLP

(57) ABSTRACT

An infrared sensor includes a stem, a thermopile element disposed on a component-mounting surface of the stem, a case for covering the thermopile element, an inner cap that covers the thermopile element in order to shield infrared rays generated by secondary emission from an inside surface of the case, and a thermo-sensing element disposed inside the inner cap. In the infrared sensor, the case includes an infrared ray transmitting window for transmitting infrared rays radiating from an object. The inner cap is thermally coupled to the stem by being disposed on the component-mounting surface of the stem, and includes an opening for passing the infrared rays from the infrared ray transmitting window of the case towards the thermopile element. The thermopile element is disposed inside a recess in the component-mounting surface or so as to be substantially surrounded by a highly thermally conductive substrate disposed on the component-mounting surface.

17 Claims, 11 Drawing Sheets ical device, such that, by, for example, convection of the air above, the temperature
INFRARED SENSOR AND ELECTRONIC DEVICE USING THE SAME

BACKGROUND OF THE INVENTION

1. Field of the Invention

The present invention relates to an infrared sensor and an electronic device including the same, and, more particularly, to an infrared sensor used in, for example, an aural thermometer and an electronic device including the same.

2. Description of the Related Art

FIG. 10 is a partially exploded perspective view of a related infrared sensor using a thermopile element. FIG. 11 is a schematic longitudinal sectional view of FIG. 10. In FIGS. 10 and 11, an infrared sensor 1 includes a metallic stem 2, a thermopile element 4, a chip-type thermistor 5 serving as a thermo-sensing element, and a metallic case 6.

Lead terminals 3 are provided at the stem 2 via glass sealing. One end (inner lead) of each lead terminal 3 is exposed at a component-mounting surface of the stem 2, while the other end (outer lead) of each lead terminal 3 protrudes towards the opposite side. The thermopile element 4 is bonded to substantially the central portion of the component-mounting surface of the stem 2 with, for example, an adhesive having good thermal conductivity, and is connected to the top portions of some of the inner leads via wires. The thermistor 5 is adjacent to the thermopile element 4 and is mounted on the stem 2, and is connected to the top portion of one of the inner leads via a wire. In general, since the central portion of the thermopile element 4 is a hot junction and a portion near the peripheral portion of the thermopile element 4 is a cold junction, the thermistor 5 is substantially disposed near the cold junction of the thermopile element 4. An edge of the case 6 is secured to and provided along the periphery of the stem 2 so as to cover the thermopile element 4, the thermistor 5, and the inner leads of the lead terminals 3. An infrared ray transmitting window 7 is provided at the top surface of the case 6 such that infrared rays emitted from a detection object are incident upon the hot junction of the thermopile element 4. For example, a silicon (Si) or germanium (Ge) material having an infrared ray interference filter for selectively passing infrared rays is used for the infrared ray transmitting window 7.

In the infrared sensor 1 having such a structure, incident infrared rays transmitted through the infrared ray transmitting window 7 from the outside are incident upon the hot junction of the thermopile element 4. In FIG. 11, reference character a represents an infrared ray incident upon the infrared sensor 1 from the outside, and reference character b represents an infrared ray transmitted through the infrared ray transmitting window 7 and incident upon the thermopile element 4. The temperature of the hot junction of the thermopile element 4 increases due to the incident infrared rays, resulting in a difference between the temperatures of the hot junction and the cold junction. In accordance with the temperature difference, an electromotive force is produced and output. Since the thermistor 5 is disposed near the cold junction of the thermopile element 4, its temperature is substantially the same as the temperature of the cold junction. Therefore, the thermistor 5 detects and outputs the absolute temperature of the cold junction. Here, the term "absolute temperature" is used to refer to a relative temperature difference, and does not refer to a temperature in the Kelvin temperature scale. Using an output corresponding to the difference between the temperature of the cold junction detected by the thermistor 5 and the temperature output from the thermopile element 4, the temperature of a detection object is measured.

Since the case 6 is made of a metal, it generally does not allow infrared rays to pass. However, although an edge of the case 6 is connected to the stem 2, the further away a portion of the case 6 is from the connection portion with the stem 2, the more difficult it is to maintain it at the same temperature as the stem 2. Therefore, the temperature of the case 6 increases due to convection of outside air, irradiation of the outside surface of the case 6 with infrared rays, or direct heating of the case 6.

When the temperature of the case 6 increases, a difference between the temperatures of the case 6 and the stem 2 occurs. When the temperature difference occurs, infrared rays are radiated to the stem 2 from the case 6 via secondary emission. In FIG. 11, the infrared rays that are radiated from the case 6 by secondary emission are represented by reference characters c. Since these infrared rays produced by secondary emission are also radiated towards the thermopile element 4 on the stem 2 from an inside surface of the case 6, the temperature of the hot junction of the thermopile element 4 is increased not only by the infrared rays that enter the infrared sensor 1 through the infrared ray transmitting window 7, but also by infrared rays that are produced by secondary emission from the case 6. Therefore, the temperature of a detection object can no longer be accurately measured.

The fact that the difference between the temperatures of the case 6 and the stem 2 affects temperature measurements means that, when the temperature of the case 6 is temporarily changed due to the aforementioned reason and reasons other than that mentioned above, the temperature detected by the infrared sensor 1 also temporarily changes. This is because a change in temperature of either one of the cold junction of the thermopile element 4 and the thermistor 5 due to a change in the temperature of the case 6 does not correspond to a change in temperature of the other of the cold junction of the thermopile element 4 and the thermistor 5. Accordingly, in the related infrared sensor 1, the detected temperature of a detection object is substantially affected by a temporary change in the temperature (that is, a disturbance) of anything other than the detection object.

To overcome this problem, for example, Japanese Unexamined Patent Application Publication No. 8-101062 discloses a structure including a shield tube for covering an infrared detector in order to prevent detection of secondary emission from a package. In this case, an error resulting from detection of secondary emission is decreased.

However, even in this case, since the infrared detector is mounted on the electronic cooling device, the shield tube is disposed so as to surround the electronic cooling device, such that it is difficult to make the temperature of the infrared detector and the temperature of the shield tube the same. In particular, the infrared detector is merely mounted on the top surface of the electronic cooling device, such that, by, for example, convection of the air above, the temperature of the infrared detector may be different from the temperature of the electronic cooling device, and, thus, from the temperature of the shield tube. If there is a difference between the temperatures of the infrared detector and the shield tube, secondary emission is not restricted. Therefore, an error resulting from detection of secondary emission is not satisfactorily reduced. In addition, the problem of the detected temperature of a detection object being easily affected by a temporary change in the temperature of anything other than the detection object is not satisfactorily prevented.

SUMMARY OF THE INVENTION

To overcome the problems described above, preferred embodiments of the present invention provide an infrared sensor which minimizes an error in temperature measurements resulting from, for example, detection of secondary emission from a case, and which is not easily influenced by disturbances, and an electronic device including such a novel infrared sensor.

To this end, according to a first preferred embodiment of the present invention, an infrared sensor includes a stem, a thermopile element disposed on a component-mounting surface of the stem, a case for covering the thermopile element, an inner cap that covers the thermopile element in order to shield infrared rays generated by secondary emission from an inside surface of the case, and a thermo-sensing element disposed inside the inner cap. In the infrared sensor, the case includes an infrared ray transmitting window for transmitting infrared rays radiating from an object. The inner cap is thermally coupled to the stem by being disposed on the component-mounting surface of the stem, and includes an opening which allows the infrared rays to pass from the infrared ray transmitting window of the case towards the thermopile element. The thermopile element is disposed in a recess in the component-mounting surface.

The depth of the recess from the component-mounting surface of the stem is preferably substantially equal to the thickness of the thermopile element. Alternatively, the depth of the recess from the component-mounting surface of the stem may be greater than the thickness of the thermopile element.

The thermo-sensing element is preferably disposed on a portion of the component-mounting surface in close proximity to the recess. Alternatively, the thermo-sensing element may be disposed on a portion of the thermopile element in close proximity to a cold junction of the thermopile element.

According to a second preferred embodiment of the present invention, an infrared sensor includes a stem, a thermopile element disposed on a component-mounting surface of the stem, a case for covering the thermopile element, an inner cap that covers the thermopile element in order to shield infrared rays generated by secondary emission from an inside surface of the case, and a thermo-sensing element disposed inside the inner cap. In the infrared sensor, the case includes an infrared ray transmitting window for transmitting infrared rays radiating from an object. The inner cap is thermally coupled to the stem by being disposed on the component-mounting surface of the stem, and includes an opening which allows the infrared rays to pass from the infrared ray transmitting window of the case towards the thermopile element. The thermopile element is disposed so as to be substantially surrounded by a thermally conductive substrate disposed on the component-mounting surface.

The thickness of the thermally conductive substrate is preferably substantially equal to the thickness of the thermopile element. Alternatively, the thickness of the highly thermally conductive substrate may be greater than the thickness of the thermopile element.

The thermo-sensing element is preferably disposed on a portion of the thermally conductive substrate in close proximity to the thermopile element. Alternatively, the thermo-sensing element may be disposed on a portion of the thermopile element in close proximity to a cold junction of the thermopile element.

According to a third preferred embodiment of the present invention, an electronic device is provided which includes the infrared sensor according to the first preferred embodiment.

With this structure, in the infrared sensor of preferred embodiments of the present invention, it is possible to minimize error in temperature measurements resulting from detection of secondary emission from the case. In addition, the temperature of the cold junction of the thermopile element and the temperature of the thermo-sensing element quickly follow each other without any substantial difference in time, such that the difference between the temperatures of the cold junction and the thermo-sensing element is greatly reduced, such that temperatures can be measured without being affected by disturbances.

In the electronic device of a preferred embodiment of the present invention, temperatures are measured with high precision without being affected by environmental changes.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
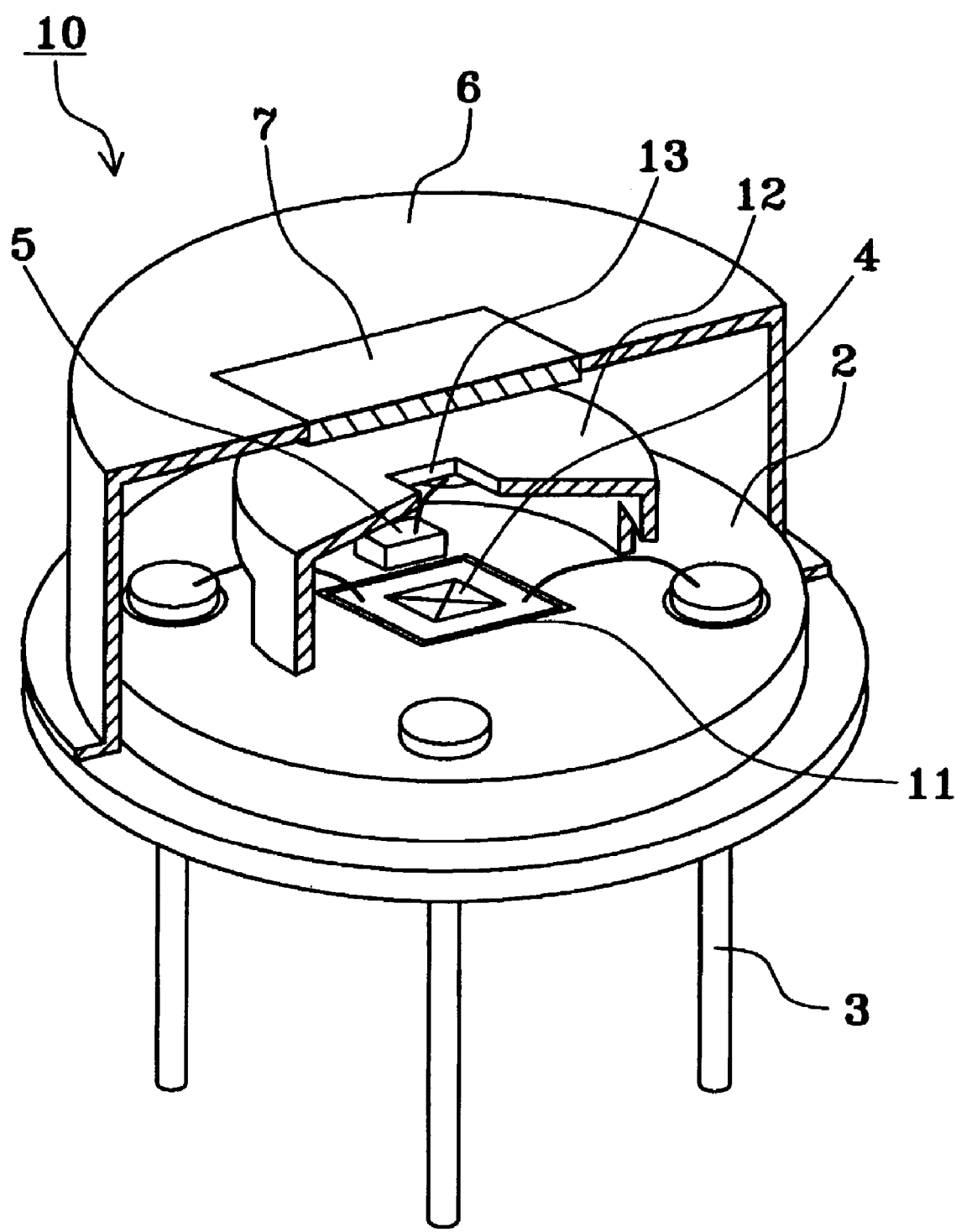
FIG. 1 is a partly exploded perspective view of an infrared sensor according to a preferred embodiment of the present invention.
Figure 2:
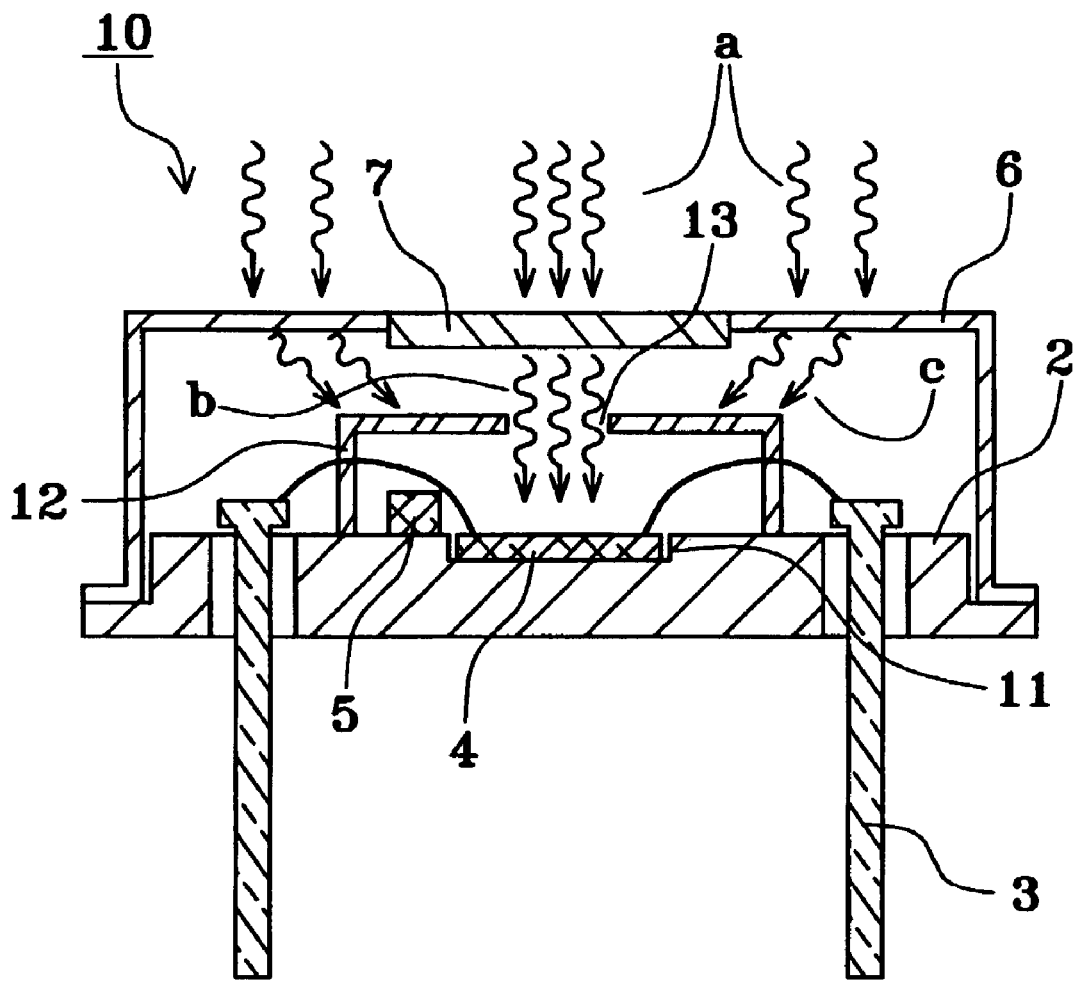
FIG. 2 is a longitudinal schematic sectional view of the infrared sensor of FIG. 1.
Figure 10:
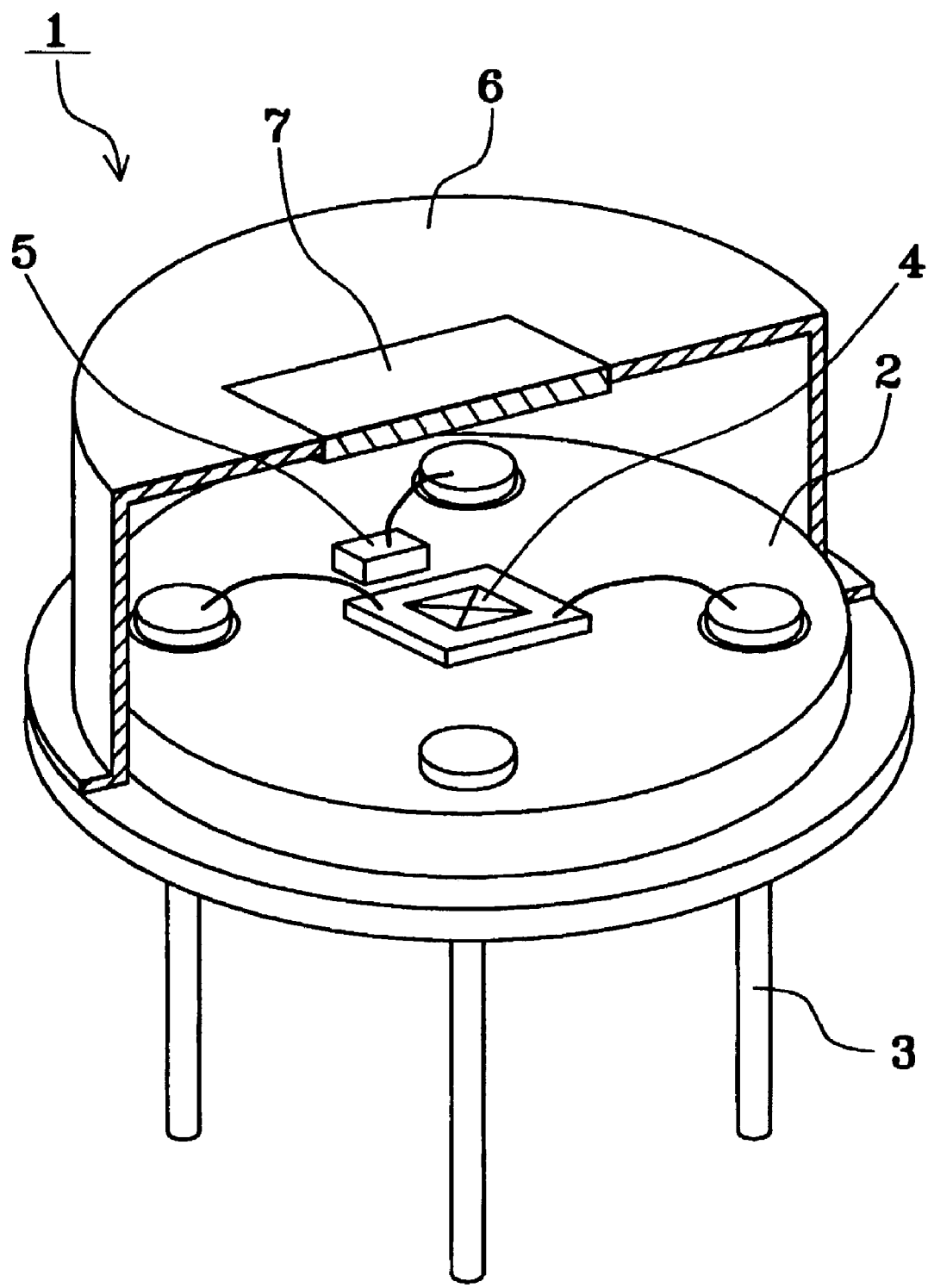
FIG. 10 is a partially exploded perspective view of the related infrared sensor.
Figure 11:
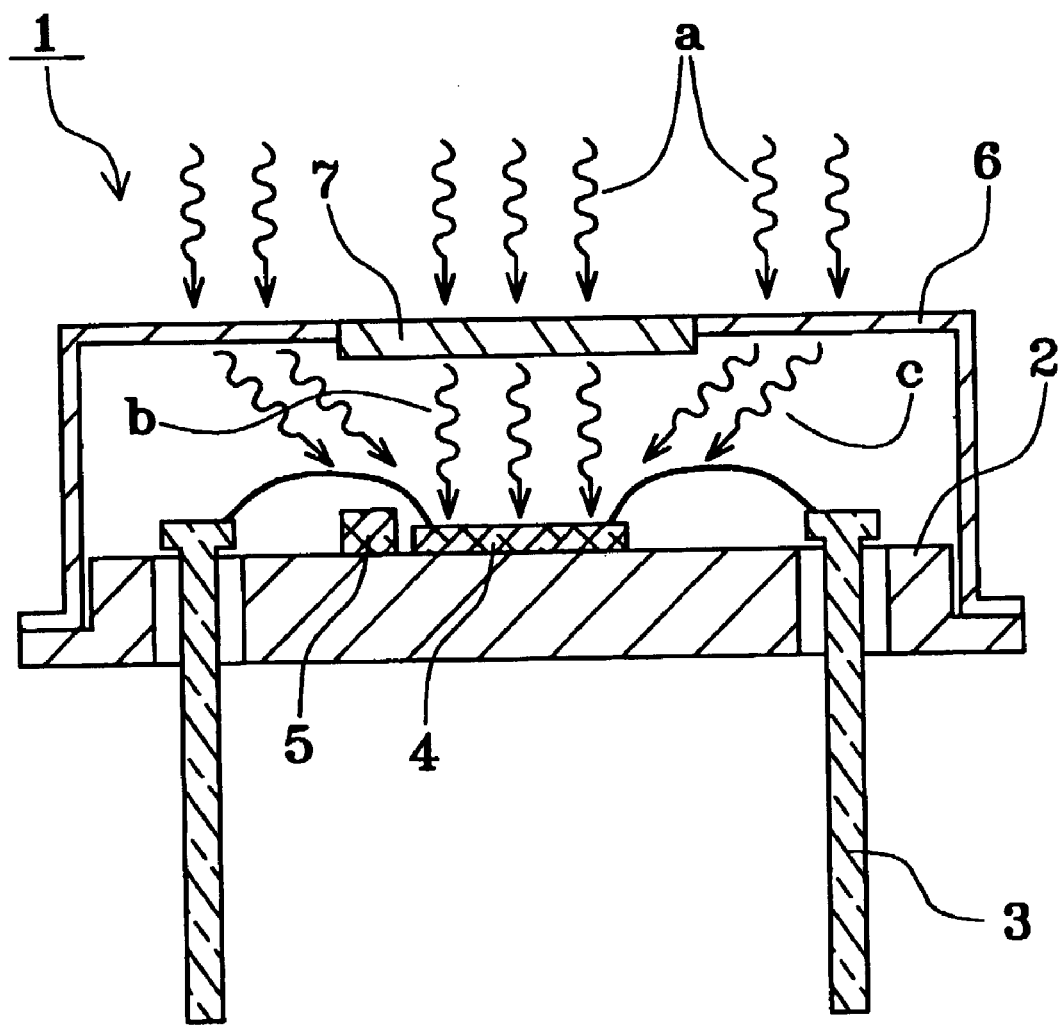
FIG. 11 is a longitudinal schematic sectional view of the infrared sensor of FIG. 10.

FIG. 1 is a partially exploded perspective view of an infrared sensor according to a preferred embodiment of the present invention. FIG. 2 is a longitudinal schematic sectional view of the infrared sensor of FIG. 1. In FIGS. 1 and 2, elements which are the same as or correspond to those shown in FIGS. 10 and 11 are given the same reference numerals and will not be described below.

In an infrared sensor 10 shown in FIGS. 1 and 2, a recess 11 having substantially the same external size as a thermopile element 4 is provided in a component-mounting surface of a stem 2, and the thermopile element 4 is accommodated in the recess 11. Since the depth of the recess 11 is approximately equal to the thickness of the thermopile element 4, the top surface of the thermopile element 4 is substantially flush with the component-mounting surface of the stem 2. A chip-type thermistor 5 is mounted on a portion in proximity to the recess 11 in the component-mounting surface of the stem 2.

A metallic inner cap 12 is mounted on the component-mounting surface of the stem 2 so as to cover the recess 11 and the thermistor 5. An edge of the inner cap 12 is in contact with the component-mounting surface of the stem 2 in order to be thermally coupled with the stem via an adhesive having good thermal conductivity or by welding. An opening 13 which allows infrared rays entering the infrared sensor 10 to pass through an infrared ray transmitting window 7 of a case 6 is provided in the top surface of the inner cap 12. The opening 13 is a through hole, so that a window material such as that of the infrared ray transmitting window 7 is not provided in the opening 13. A few holes through which wires extend are provided in a side surface of the inner cap 12.

Figure 3:
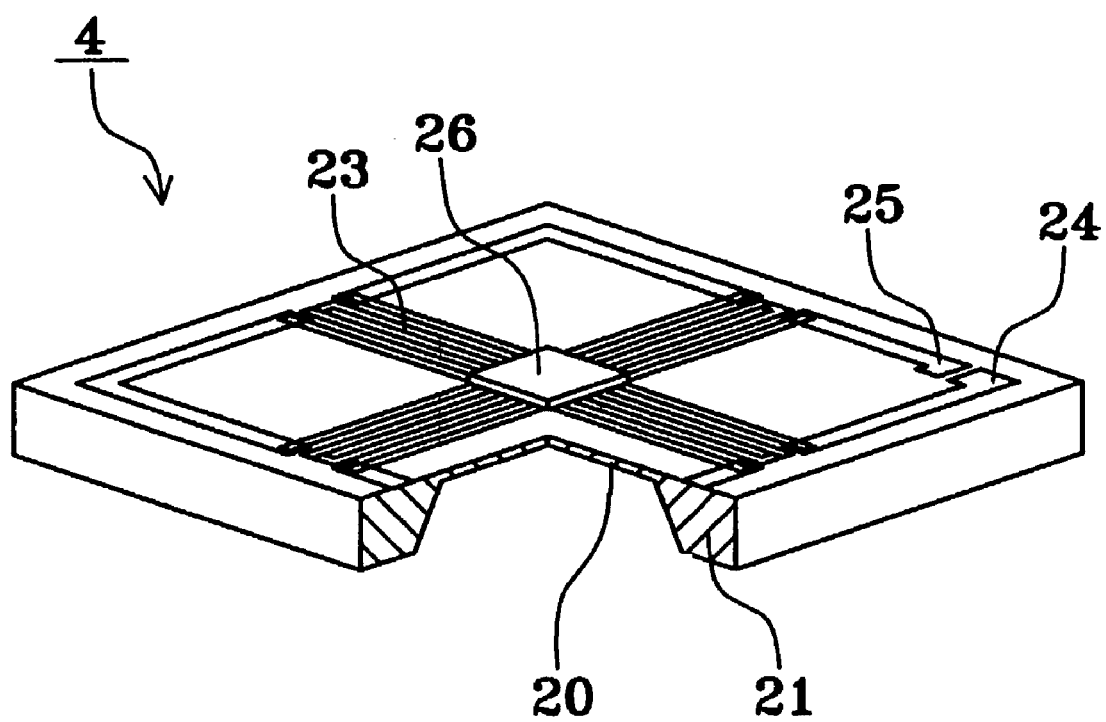
FIG. 3 is a partially exploded side view of an example of a thermopile element used in the infrared sensor of FIG. 1.

A description of the structure of the thermopile element 4 will now be given with reference to FIG. 3. FIG. 3 is a partially exploded enlarged perspective view of an example of the thermopile element 4. The thermopile element 4 includes a thin-film portion 20, a heat sink portion 21, and a plurality of thermocouples 23. The thin film portion 20 is disposed at the central portion of the thermopile element 4 and is a diaphragm. The heat sink portion 21 includes a substantially square frame and is disposed at the peripheral portion of the thin film portion 20. The plurality of thermocouples 23 are provided on both of the thin film portion 20 and the heat sink portion 21. The thin film portion 20 and the heat sink portion 21 are formed by etching a silicon substrate which, for example, is about 1.7 mm per side and has a thickness of about 0.3 mm and which includes a thin insulating film thereon, such as an $SiO_2$ or an $Al_2O_3$ film, or a plurality of such thin insulating films. The thin film portion 20 corresponds to a portion of the thin insulating film remaining after the entire silicon substrate has been etched. For example, it is about 0.95 mm per side and has a thickness of about 2 $\mu$m to about 3 $\mu$m. Approximately 100 to 200 thermocouples 23 are provided with a portion of each thermocouple 23 disposed at substantially the central portion of the thin film portion 20 defining a hot junction and a portion of each thermocouple 23 disposed at the heat sink portion 21 defining a cold junction. The thermocouples 23 are connected in series such that ends are connected to respective electrodes 24 and 25. An infrared ray absorber 26 is mounted on the hot junctions of the plurality of thermocouples 23. By this, it can be seen that the hot junctions and the cold junctions are disposed on the top surface of the thermopile element 4.

Since the hot junctions of the thermocouples 23 disposed on the thin film portion 20 are provided on a thin film having a small heat capacity, their temperatures change quickly. In contrast, since the cold junctions of the thermocouple 23 disposed on the heat sink portion 21 are arranged where the silicon substrate disposed therebelow is thick and has a large heat capacity, their temperatures do not change quickly and are relatively stable. Therefore, in the thermopile element 4, temperature changes of the hot junctions of the thermocouples 23 are accurately detected by a comparison with the temperatures of the cold junctions.

The thermopile element 4 having such a structure is secured inside the recess 11 in the component-mounting surface of the stem 2 with, for example, a thermally conductive adhesive. Although the side surfaces of the thermopile element 4 may be directly in contact with the inside surfaces defining the recess 11 or in contact therewith through the adhesive, a small gap may exist between the side surfaces of the thermopile element 4 and the inside surfaces defining the recess 11.

As mentioned above, the top surface of the thermopile element 4 and the component-mounting surface of the stem 2 are flush with each other. Therefore, compared to the instance where the thermopile element 4 protrudes from the component-mounting surface as in the related example, differences between the temperatures of the top surface of the thermopile element 4 and the component-mounting surface caused by, for example, convection of air, do not easily occur. If the side surfaces of the thermopile element 4 are in contact with the inside surfaces defining the recess 11, temperature differences do not easily occur because thermal coupling occurs by conduction. In the instance where there is a gap between the side surfaces of the thermopile element 4 and the inside surfaces defining the recess 11, if this gap is narrow, air having different temperatures is unlikely to enter the gap, and temperature differences caused by thermal coupling by emission between the side surfaces of the thermopile element 4 and the inside surfaces defining the recess 11 do not easily occur. The phrase "temperature differences do not easily occur" also means that, even if, for some reason, a temperature difference occurs, the temperature of either one of the thermopile element 4 and the stem 2 immediately becomes the same as the temperature of the other of the thermopile element 4 and the stem 2.

Since the cold joints are disposed on the top surface and at the peripheral portion of the thermopile element 4, temperature differences between the cold joints of the thermopile element 4 and the component-mounting surface of the stem 2 do not easily occur, such that the temperature followability is very good. This means that differences between the temperatures of the cold junctions of the thermopile element 4 and the thermistor 5 on the stem 2 do not easily occur. By this, the temperature of a detection object is measured much more precisely.

The inner cap 12 is mounted on the component-mounting surface of the stem 2. Since the opening 13 is provided in the inner cap 12, infrared rays that enter the infrared sensor 10 through the infrared ray transmitting window 7 of the case 6 are directed to the thermopile element 4, whereas infrared rays radiated towards the thermopile element 4 by secondary emission from any of the inside surfaces of the case 6 are reflected. For this reason, the thermopile element 4 is prevented from detecting secondary emission from the case 6.

In addition, since the inner cap 12 is thermally coupled to the stem 2, the temperature of the inner cap 12 is substantially the same as the temperature of the stem 2 at all times. Therefore, radiation of infrared rays from the inner cap 12 itself by secondary emission as a result of an increase in temperature of the inner cap 12 by secondary emission from the case 6 does not occur. Therefore, errors in temperature measurements resulting from secondary emission from the case 6 are greatly reduced.

Strictly speaking, even if the inner cap 12 is thermally coupled to the stem 2, since the inner cap 12 is made of a plate-shaped material, a slight difference between the temperature of connection points with the stem 2 and points located away from the connection points cannot be entirely prevented from occurring. However, in the infrared sensor 10 according to preferred embodiments of the present invention, since the thermopile element 4 is accommodated in the recess 11, the inner cap 12 is thinner than the inner cap of the related art. Since, by making the inner cap 12 thinner, the distances between the connection points with the stem 2 of the inner cap 12 and points disposed away from the connection points of the inner cap 12 are reduced, in preferred embodiments of the present invention, differences between the temperatures of portions inside the inner cap 12 are minimized. As a result, errors in temperature measurements resulting from secondary emission are reduced to an essentially negligible value.

As described above, in the infrared sensor 10, by the combined action resulting from accommodating the thermopile element inside the recess in the stem and providing an inner cap for covering the thermopile element and the thermo-sensing element, errors in temperature detection are greatly reduced.

Figure 4:
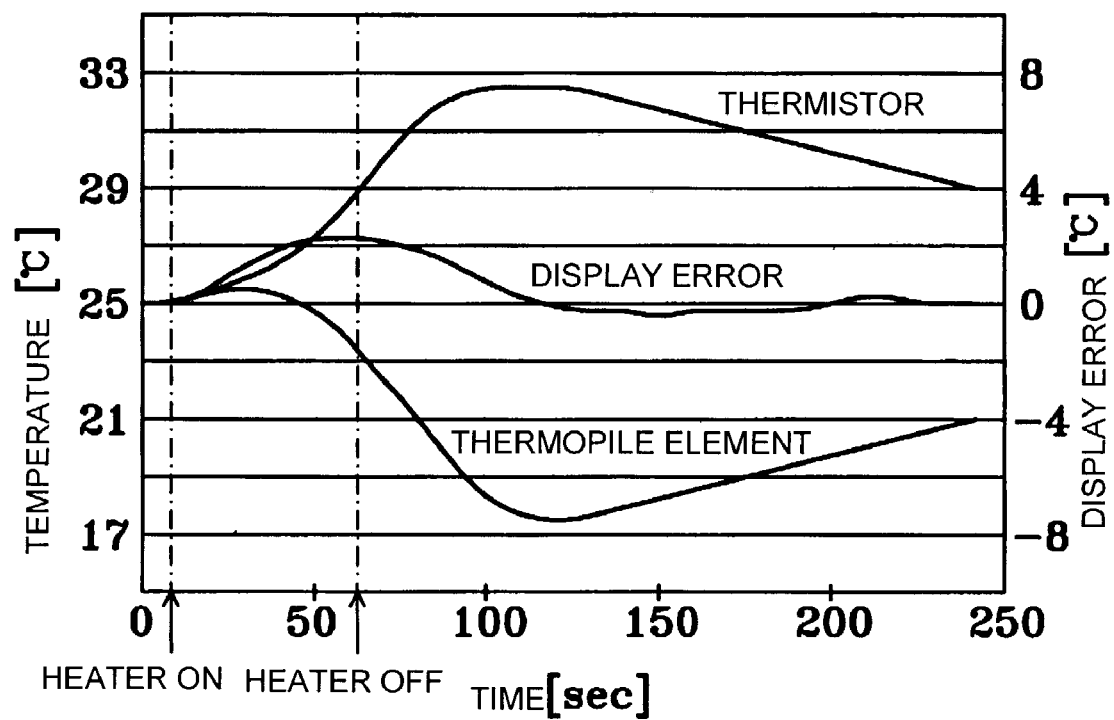
FIG. 4 is a diagram showing the temperature followability when a related infrared sensor is heated.
Figure 5:
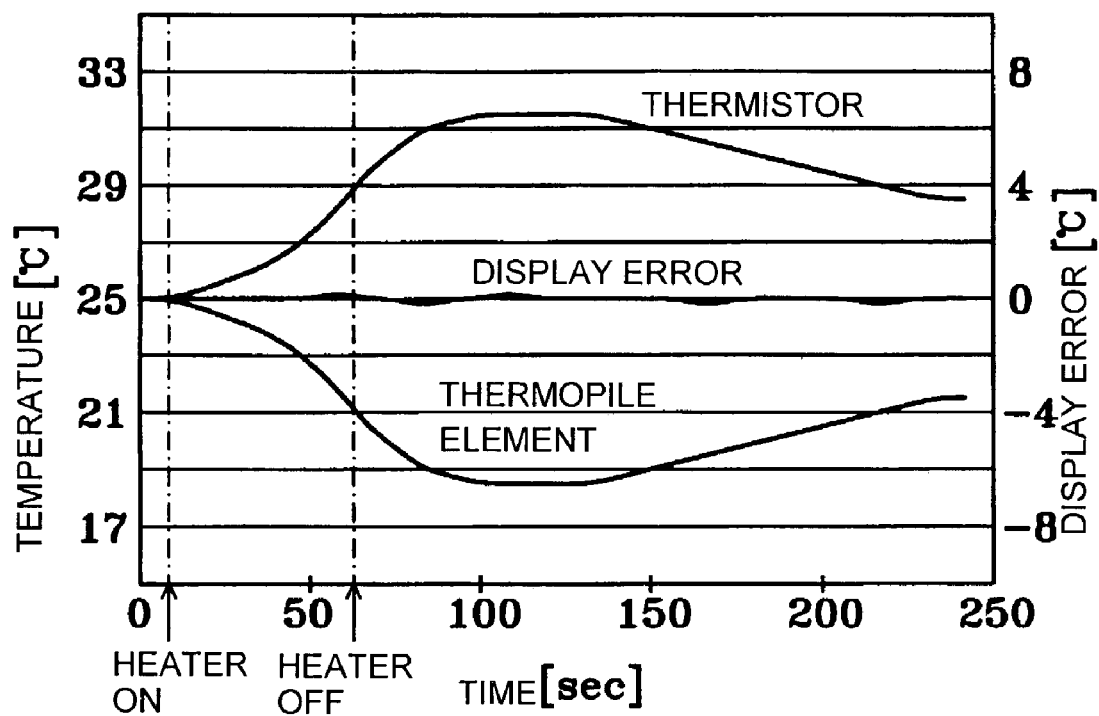
FIG. 5 is a diagram showing the temperature followability when the infrared sensor of preferred embodiments of the present invention is heated.

FIG. 4 is a characteristic diagram of temperature followability when the related infrared sensor 1 is heated. FIG. 5 is a characteristic diagram of temperature followability when the infrared sensor 10 of the present invention is heated. These figures show how the temperature obtained from a signal output from the thermopile element, the temperature obtained from a signal output from the thermo-sensing element, and a detected temperature (display error) of an object that is detected by the infrared sensor (the detected temperature is obtained by calculating the temperature obtained from the signal output from the thermopile element and the temperature obtained from the signal output from the thermo-sensing element) change with time, when a heater is mounted to a side surface of the case of the infrared sensor and the case is overheated by turning the heater on for a desired period of time. This overheating corresponds to the aforementioned disturbance. The temperature of the object is kept unchanged at approximately 25° C.

In the related infrared sensor 1 shown in FIG. 4, when the temperature of the stem 2 is increased by heating the case 6 with the heater, the temperature detected by the thermistor 5 and the temperature of the cold junctions of the thermopile element 4 are also increased accordingly. Here, the hot junctions of the thermopile element 4 are irradiated with infrared rays that are radiated from the object at 25° C. and that are transmitted through the infrared ray transmitting window 7, such that the hot junctions are at a corresponding temperature. Therefore, the temperature of the cold junctions is higher than the temperature of the hot junctions.

Here, when no secondary emission from any of the inside surfaces of the case 6 is produced, the change in temperature is the same for the thermistor 5 and the cold junctions of the thermopile element 4, such that, when the output from the thermopile element 4 is converted into temperature, the output temperature of the thermopile element 4 drops in correspondence with the temperature increase of the thermistor 5. Therefore, the temperature of the object that is detected by the infrared sensor 10, which is obtained by calculating both the temperature of the thermopile element 4 and the temperature of the thermistor 5, is maintained at a constant 25° C.

However, in the related infrared sensor 1, since there is secondary emission from the inside surfaces of the case 6, the hot junctions and the cold junctions of the thermopile element 4 are irradiated with heat. Here, although the cold junctions are almost unaffected by irradiation of heat because they are disposed on the heat sink portion of the thermopile element and have high heat capacity, the hot junctions are affected by infrared rays produced by secondary emission in addition to infrared rays from the object because they are disposed on the diaphragm and have a low heat capacity. Therefore, output obtained after temperature conversion from the thermopile element 4 is greater than the actual value, such that an error in temperature measurements occurs.

In contrast, in the infrared sensor 10 according to a preferred embodiment of the present invention shown in FIG. 5, by providing the inner cap 12 between the case 6 and the thermopile element 4 and between the case 6 and the thermistor 5, secondary emission from any of the inside surfaces of the case 6 is blocked, such that the effects of secondary emission are eliminated. In addition, since the inner cap 12 is thermally coupled with the stem 2, the stem 2 and the thermopile element 4, the thermistor 5, and the inner cap 12 are always at the same temperature even if external temperature changes occur. Therefore, heat radiation with respect to the thermopile element 4 and with respect to the opposing inner cap 12 are the same, such that they cancel each other. As a result, the thermopile element 4 is not affected by secondary emission from the inner cap 12.

Therefore, in the infrared sensor 10 according to preferred embodiments of the present invention, even if the case 6 is heated by the heater, the amounts of change in outputs from the thermistor 5 and the thermopile element 4 are the same, such that the temperature of the object that is detected by the infrared sensor 10, which is obtained by calculating the temperatures of both the thermopile element 4 and the thermistor 5, is kept at a constant 25° C.

Accordingly, in the infrared sensor according to preferred embodiments of the present invention, by eliminating the effects of secondary emission from the inside portion of the case 6, the temperature of an object alone is precisely detected without being influenced by changes in temperature that have nothing to do with the temperature of the object.

Although, in the infrared sensor 10, the top surface of the thermopile element 4 is flush with the component-mounting surface of the stem 2 by making the depth of the recess 11 in the component-mounting surface of the stem 2 substantially the same as the thickness of the thermopile element 4, the present invention is not limited thereto. For example, even if the recess is slightly shallower that the thickness of the thermopile element 4, effects substantially the same as those obtained when the depth of the recess and the thickness of the thermopile element are the same are achieved. Alternatively, when the depth of the recess is greater than the thickness of the thermopile element, the top surface of the thermopile element is surrounded by the inside surfaces defining the recess, such that the effects are the same as or better than those obtained when the depth of the recess and the thickness of the thermopile element are the same.

Although, in the infrared sensor 10, the chip-type thermistor 5 is mounted on a portion is proximity to the recess 11 of the component-mounting surface of the stem 2, it is possible to, for example, slightly increase the width of the heat sink portion of the thermopile element and mount the chip-type thermistor on the increased width portion. Alternatively, the chip-type thermistor may be disposed on the heat sink portion of the thermopile element and on the cold joints of the thermopile element.

Still alternatively, although this only applies to the case where the top surface of the thermopile element and the component-mounting surface of the stem are flush with each other, the chip-type thermistor may be mounted on both the component-mounting surface of the stem and the heat sink portion of the thermopile element. In this case, since the component-mounting surface of the stem and the cold junctions of the thermopile element are thermally coupled through the chip-type thermistor, the temperature differences between the stem, the thermopile element, and the thermistor are further reduced.

Figure 6:
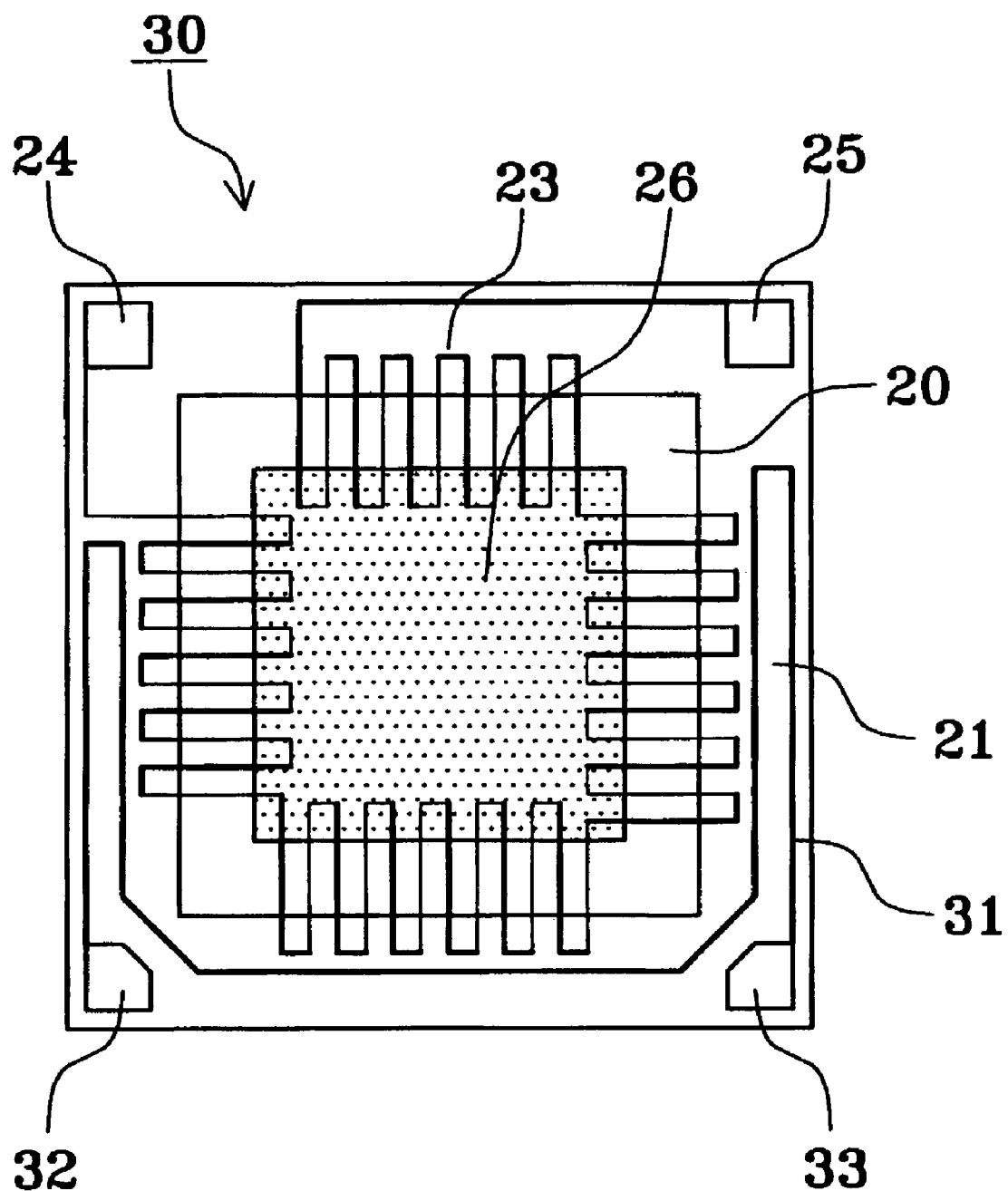
FIG. 6 is a plan view of another example of the thermopile element included in the infrared sensor of preferred embodiments of the present invention.

Although, in the infrared sensor 10, the chip-type thermistor is preferably used as the thermo-sensing element, the thermo-sensing element is not limited thereto. For example, the thermo-sensing element may be integrally formed with the thermopile element. FIG. 6 is a plan view of an example of a thermopile element including a thermo-sensing element integrally formed therewith. In FIG. 6, elements of the thermopile element that are essentially the same as those of the thermopile element 4 shown in FIG. 3 are given the same reference numerals, and will not be described.

In a thermopile element 30 shown in FIG. 6, a thin-film thermo-sensitive resistor 31 defining a thermo-sensing element is provided on a heat sink portion 21 in the vicinity of the cold junctions of the thermopile element, with ends being connected to respective terminals 32 and 33. The thermopile element 30 having such a structure is integrally formed with the thermo-sensing element, and the thermo-sensing element itself has almost no heat capacity. Therefore, by the thermo-sensing element, the temperature of the heat sink portion of the thermopile element, that is, the temperature of the cold junctions is very precisely detected. In particular, the followability of the temperature of the thermo-sensing element with respect to a change in the temperature of the thermopile element is outstanding.

Therefore, by using the thermopile element 30 in the infrared sensor of preferred embodiments of the present invention, temperature detection performance is further improved.

Figure 7:
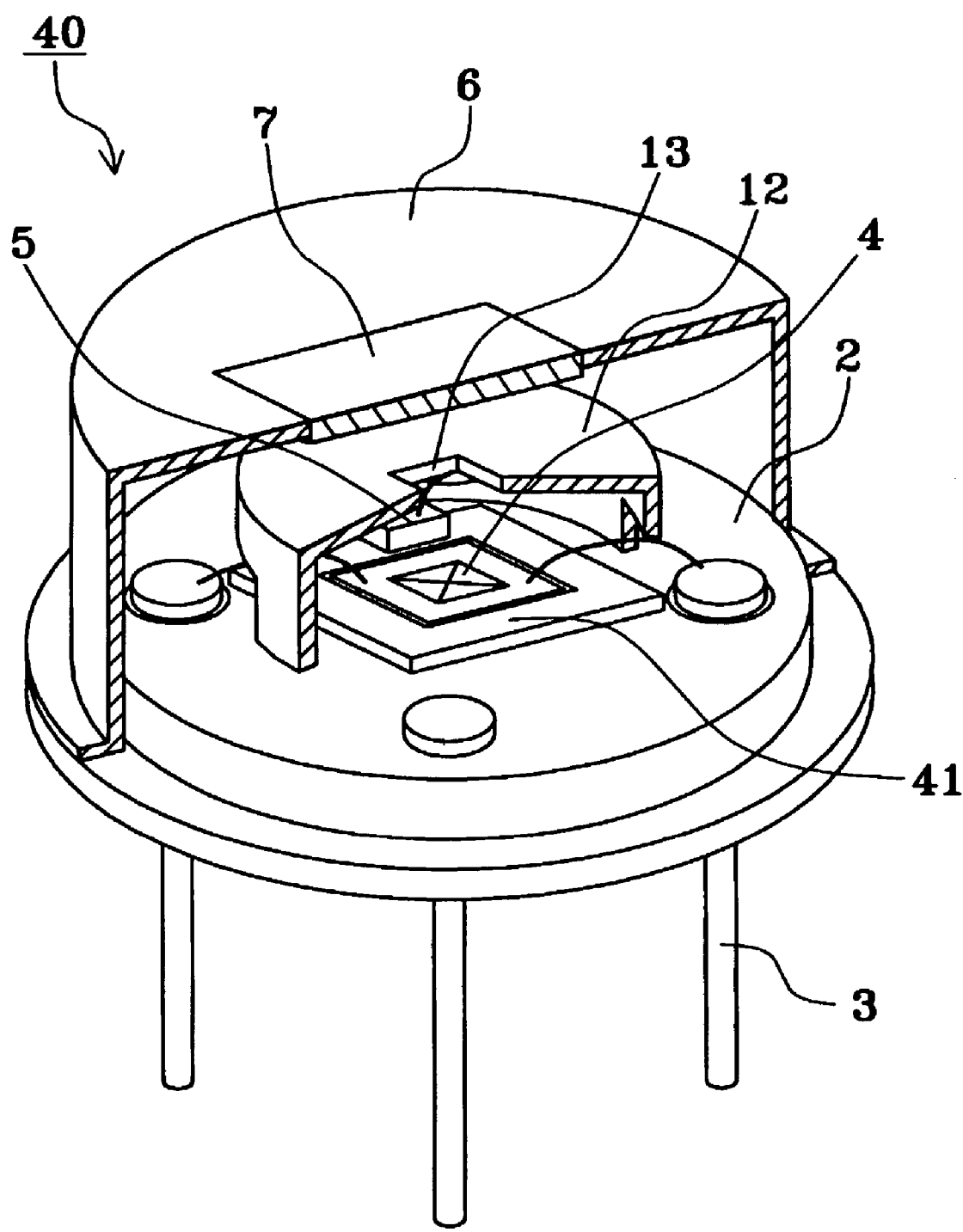
FIG. 7 is a partially exploded perspective view of an infrared sensor according to another preferred embodiment of the present invention.
Figure 8:
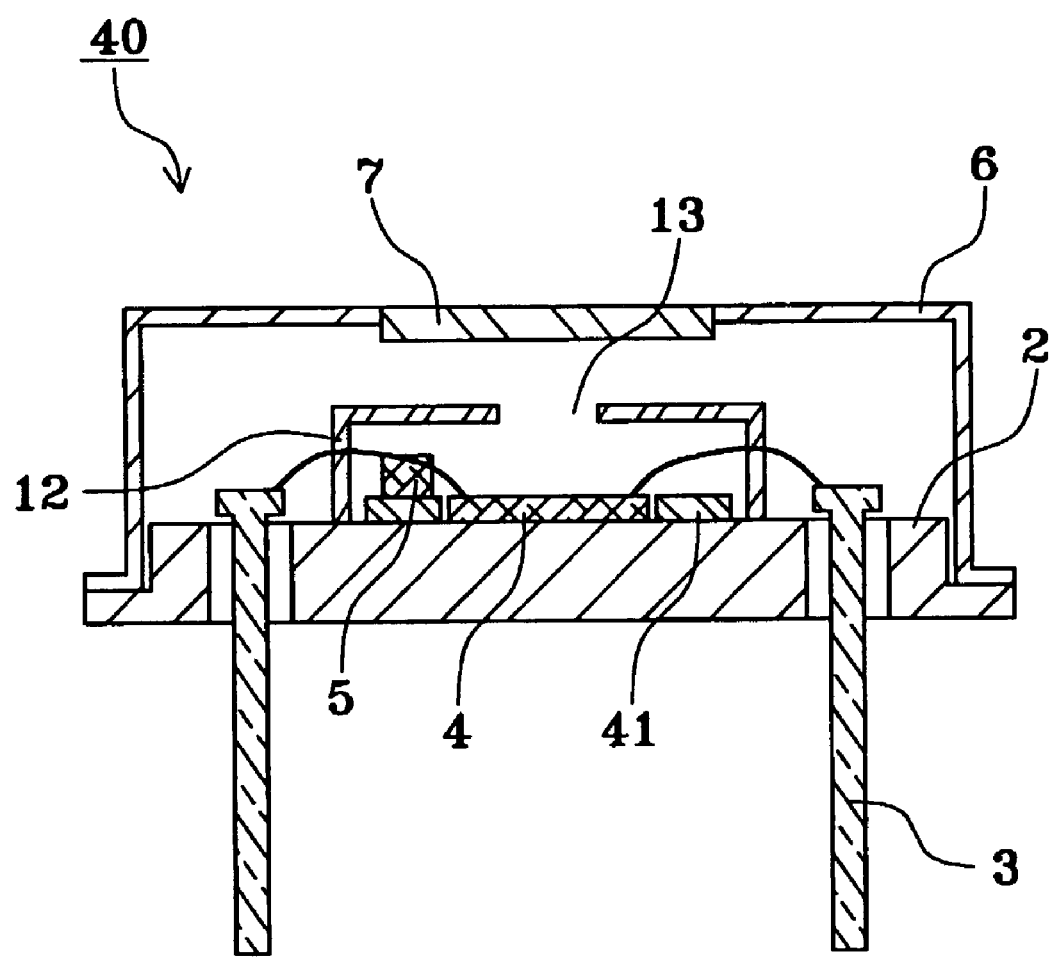
FIG. 8 is a longitudinal schematic sectional view of the infrared sensor of FIG. 7.

FIG. 7 is a partially exploded perspective view of an infrared sensor according to another preferred embodiment of the present invention. FIG. 8 is a longitudinal schematic sectional view of FIG. 7. In FIGS. 7 and 8, elements which are the same as or correspond to elements shown in FIGS. 1 and 2 are given the same reference numerals, and will not be described.

In an infrared sensor 40 shown in FIG. 7, instead of a recess such as the recess of the infrared sensor 10, a frame-shaped substrate 41 having high thermal conductivity is disposed on a component-mounting surface of a stem 2. A through hole having substantially the same external size as a thermopile element 4 is provided in the center of the highly thermally conductive substrate 41. The thermopile element 4 is directly mounted on the component-mounting surface of the stem 2 while being accommodated inside the through hole. Since the thickness of the highly thermally conductive substrate 41 is substantially the same as the thickness of the thermopile element 4, the top surface of the thermopile element 4 is flush with the top surface of the highly thermally conductive substrate 41. A chip-type thermistor 5 is mounted on a portion in the vicinity of the through hole of the top surface of the highly thermally conductive substrate 41. Although the highly thermally conductive substrate 41 may be made of the same type of metal as the stem 2, it may be an insulating substrate made of a material having high thermal conductivity, such as alumina. The highly thermally conductive substrate 41 is mounted to the stem 2 via welding or via an adhesive having good thermal conductivity. The other features of the infrared sensor 40 are preferably the same as those of the infrared sensor 10.

In the infrared sensor 40, a portion of the component-mounting surface of the stem 2 of the infrared sensor 10 is essentially disposed in a bulging manner along with the recess by an amount corresponding to the thickness of the thermopile element 4, such that substantially the same operational advantages as those of the infrared sensor 10 are achieved.

Since the thickness of the highly thermally conductive substrate 41 corresponds to the depth of the recess 11 in the infrared sensor 10, the depth of the recess can be varied to vary the thickness of the highly thermally conductive substrate 41, such that the same operational advantages are achieved. Obviously, the location of the thermistor 5 can be similarly varied.

In the infrared sensor 40, since a recess is not provided in the stem 2, a general-purpose part can be used. Therefore, depending upon the difference in cost between it and the highly thermally conductive substrate 41, costs are reduced.

In particular, when an insulating substrate is used as the highly thermally conductive substrate 41, circuit wiring formation on the insulating substrate or mounting of a chip-shaped electronic part onto the insulating substrate are easily performed. Therefore, the infrared sensor can be designed with greater freedom.

In the infrared sensor 40, the highly thermally conductive substrate 41 does not need to have a frame shape. A plurality of highly thermally conductive, substantially rectangular substrates 41 may be mounted so as to surround the thermopile element 4, in which case the same operational advantages are achieved.

Figure 9:
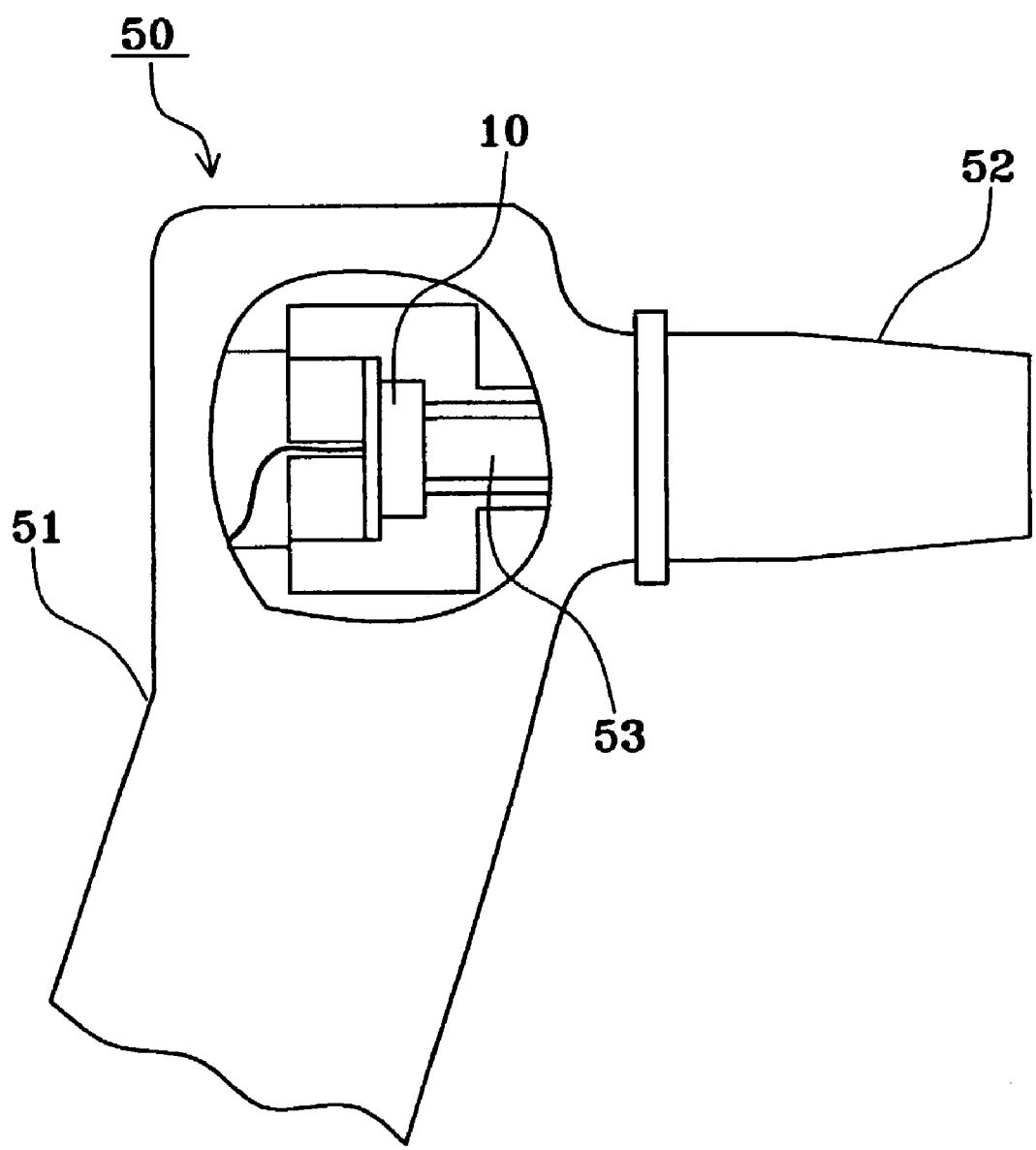
FIG. 9 is an exploded side view of an electronic device of a preferred embodiment of the present invention.

FIG. 9 is a partially exploded side view of an electronic device according to a preferred embodiment of the present invention. In FIG. 9, an aural thermometer 50, which is one type of electronic device, includes a housing 51 and an insertion portion 52 for inserting an ear. The infrared sensor 10 according to preferred embodiments of the present invention is provided at an end of a guide 53 disposed inside the insertion portion 52.

Since the infrared sensor 10 is used in the aural thermometer 50, even if the aural thermometer 50 is moved from a low-temperature room during, for example, the winter, by a subject or is again and again put into an ear to repeatedly measure temperatures, errors in body temperature measurements are prevented from occurring.

Although, in FIG. 9, an aural thermometer is shown as the electronic device, the electronic device is not limited thereto. Any type of electronic device may be used as long as it uses the infrared sensor according to preferred embodiments of the present invention.

In the infrared sensor according to preferred embodiments of the present invention, by accommodating the thermopile element in the recess formed in the component-mounting surface of the stem, the difference between the temperatures of the cold junctions of the thermopile element and the stem are greatly reduced in order to improve the followability between the temperatures of the cold junctions of the thermopile element and the stem. In addition, by providing an inner cap that is thermally coupled to the stem such that it covers the thermopile element and the thermo-sensing element, the thermopile element does not detect a secondary emission from the case. Further, secondary emissions from the inner cap are prevented. As a result, the infrared sensor according to preferred embodiments of the present invention accurately detects the temperature of a detection object without being influenced by disturbances.

Accordingly, the electronic device according to another preferred embodiment of the present invention measures temperature with high precision without being affected by environmental changes.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An infrared sensor comprising:
a stem;
a thermopile element disposed on a component-mounting surface of the metallic stem;
a case for covering the thermopile element;
an inner cap that covers the thermopile element in order to shield infrared rays generated by secondary emission from an inside surface of the case; and
a thermo-sensing element disposed inside the inner cap; wherein
the case includes an infrared ray transmitting window for transmitting infrared rays radiating from an object;
the inner cap is thermally coupled to the metallic stem by being disposed on the component-mounting surface of the stem, and includes an opening for allowing the infrared rays from the infrared ray transmitting window of the case to pass towards the thermopile element; and
the thermopile element is disposed inside a recess in the component-mounting surface.

2. An infrared sensor according to claim 1, wherein the depth of the recess in the component-mounting surface of the stem is substantially equal to the thickness of the thermopile element.

3. An infrared sensor according to claim 1, wherein the depth of the recess in the component-mounting surface of the stem is greater than the thickness of the thermopile element.

4. An infrared sensor according to claim 1, wherein the thermo-sensing element is disposed on a portion of the component-mounting surface in the vicinity of the recess.

5. An infrared sensor according to claim 1, wherein the thermo-sensing element is disposed on a portion of the thermopile element in the vicinity of a cold junction of the thermopile element.

6. An infrared sensor according to claim 1, wherein the inner cap is arranged to be in contact with the component-mounting surface of the stem so as to be thermally coupled with the step via a thermally conductive adhesive or via welding.

7. An infrared sensor according to claim 1, wherein the thermopile element is secured in the recess via a thermally conductive adhesive.

8. An electronic device comprising the infrared sensor of claim 1.

9. An infrared sensor comprising:
a stem made of a metallic material;
a thermopile element disposed directly on a component-mounting surface of the stem;
a case for covering the thermopile element;
an inner cap that covers the thermopile element in order to shield infrared rays generated by secondary emission from an inside surface of the case; and
a thermo-sensing element disposed inside the inner cap; wherein
the case includes an infrared ray transmitting window for transmitting infrared rays radiating from an object;
the inner cap is thermally coupled to the stem by being disposed on the component-mounting surface of the stem, and includes an opening for allowing the infrared rays from the infrared ray transmitting window of the case to pass towards the thermopile element; and
the thermopile element is arranged so as to be substantially surrounded by a highly thermally conductive substrate disposed on the component-mounting surface.

10. An infrared sensor according to claim 9, wherein the thickness of the highly thermally conductive substrate is substantially equal to the thickness of the thermopile element.

11. An infrared sensor according to claim 9, wherein the thickness of the highly thermally conductive substrate is greater than the thickness of the thermopile element.

12. An infrared sensor according to claim 9, wherein the thermo-sensing element is disposed on a portion of the highly thermally conductive substrate in the vicinity of the thermopile element.

13. An infrared sensor according to claim 9, wherein the inner cap is arranged to be in contact with the component-mounting surface of the stem so as to be thermally coupled with the stem via a thermally conductive adhesive or via welding.

14. An infrared sensor according to claim 9, wherein the thermopile element is secured to the highly thermally conductive substrate via a thermally conductive adhesive.

15. An infrared sensor according to claim 9, wherein the thermo-sensing element is disposed on a portion of the thermopile element in the vicinity of a cold junction of the thermopile element.

16. An infrared sensor according to claim 9, wherein the highly thermally conductive substrate is frame-shaped.

17. An electronic device comprising the infrared sensor of claim 9.

* * * * *